United States Patent [19]

Tate et.al.

[11] Patent Number: 4,774,634

[45] Date of Patent: Sep. 27, 1988

[54] PRINTED CIRCUIT BOARD ASSEMBLY

[75] Inventors: Howard L. Tate, Newman Lake; Gary L. Romeike; Vinai M. Tara; James L. Vocture, all of Spokane, all of Wash.

[73] Assignee: Key Tronic Corporation, Spokane, Wash.

[21] Appl. No.: 820,239

[22] Filed: Jan. 21, 1986

[51] Int. Cl.4 .............................................. H05K 1/18
[52] U.S. Cl. ...................................... 361/400; 29/832; 29/831; 361/407; 361/409
[58] Field of Search ....... 174/68.5; 361/400, 403–407, 361/409, 414; 29/832, 833–841, 831; 156/291, 331.7, 310

[56] References Cited

U.S. PATENT DOCUMENTS

| | | | |
|---|---|---|---|
| 3,200,020 | 8/1965 | Schroeder | 174/68.5 X |
| 3,433,888 | 3/1969 | Tally et al. | 174/68.5 |
| 3,562,592 | 2/1971 | Cooke et al. | 361/409 |
| 3,676,252 | 7/1972 | Allington | 156/277 |
| 4,208,005 | 6/1980 | Nate et al. | 29/834 X |
| 4,339,785 | 7/1982 | Ohsawa | 361/403 |
| 4,352,858 | 10/1982 | Stanley | 156/331.7 X |
| 4,363,076 | 12/1982 | McIver | 361/403 X |
| 4,554,033 | 11/1985 | Dery et al. | 174/88 R |
| 4,588,456 | 5/1986 | Dery et al. | 174/88 R |
| 4,635,354 | 1/1987 | Chrobak et al. | 29/834 X |

FOREIGN PATENT DOCUMENTS

| | | | |
|---|---|---|---|
| 8400464 | 2/1984 | Japan | 29/832 |
| 1133701 | 1/1985 | U.S.S.R. | 29/832 |

OTHER PUBLICATIONS

Wadhwa, S. K., "Low-Cost CKT Pkging", IBM Discl. Bul. vol. 22 No. 2 Jul. 1979 p. 522.
Comerford, L. D., "Flip Chip Bonded Ground Plane for Ceramic Chip Carriers", vol. 24, No. 4, 9/81 pp. 1978–1979.
Bolger, Justin C., Astle, Robert J., Morano, Silvio L. "Conductive Adhesives, Inks, and Coatings", Adhesives for Industry, Jun 24–25 pp. 70–90.

Primary Examiner—A. T. Grimley
Assistant Examiner—Jane K. Lau
Attorney, Agent, or Firm—Wells, St. John & Roberts

[57] ABSTRACT

A printed circuit assembly includes surface mounted circuit components held in place on a printed circuit board by a rigid connection. The outwardly extending leads of the circuit component are bonded to conductive areas of the board by an electrically conducting flexible adhesive. The combination of a rigid mechanical connection between the body portion of the circuit component and the board and a flexible, electrically conductive connection between each lead end and the board provides an arrangement capable of withstanding shock loading, as well as vibrational and bending forces to which the assembly might be subjected. The assembly lends itself to relatively inexpensive circuit boards produced by printing techniques, typically including applied metal buses that serve as low resistance shunts to the power connections of the circuit components.

21 Claims, 6 Drawing Sheets

PRINTED CIRCUIT BOARD ASSEMBLY

FIELD OF THE INVENTION

This disclosure relates to production of printed electronic circuit boards having surface mounted circuit components, such as external pin connectors, integrated circuits, light emitting diodes, resistors, transistors, capacitors, etc. It relates to a printed circuit board having a unique arrangement of conductive pad areas and adjacent uncovered substrate areas to which conventional circuit components can be adhesively secured for both electrical and mechanical purposes.

BACKGROUND OF THE INVENTION

This invention arose from a continuing effort to simplify production of printed circuit boards requiring attachment of circuit components, thus reducing the overall cost of each completed assembly. It arose specifically from design of full-travel input keyboards having dedicated microprocessors, but is adaptable to any application of printed circuit technology where external circuit components are mounted to the board.

The evolution of this invention began with attempts to produce conductive traces and pads about a printed circuit board by direct printing techniques, rather than by etching clad substrate surfaces, a process which is more complicated and expensive than printing. It was found that effective multilayer traces could be produced on a single surface of an insulating substrate by silk screening alternate layers of a conductive ink and a covering dielectric. While this process of printed circuit board fabrication was amenable to conventional mounting of circuit components by soldering techniques, the expense of producing soldered joints, plus the relatively high temperatures encountered during soldering, limited the cost reductions achieved through use of such printing techniques.

A study of known surface-mounting arrangements for circuit components indicated that such components could be attached to one side of a printed circuit board by soldered terminals, with or without mechanical connection of the body portion of the circuit component to the underlying printed circuit board. However, applying solder to the relatively delicate screened traces and pads on the operational side of a printed circuit board is both expensive and a hazard to the integrity of the printed circuit, which typically cannot withstand the elevated temperatures of molten solder. Furthermore, soldered connections are rigid, and effective surface-mounting of circuit components by soldered connections therefore requires a rigid substrate to assure against relative movement between the surface-mounted body portion of the circuit component and its surface-mounted leads.

The limitations of the previously-known methods for surface-mounting circuit components on a printed circuit board have been overcome by the synergistic utilization of two different adhesives—a flexible, electrically conductive adhesive for attaching the conductive leads to underlying exposed conductive pads in the printed circuit, and a rigid mechanical adhesive for bonding the body portions of the circuit components to the board. This combination of adhesive systems assures a durable mounting arrangement for the circuit components. The flexible lead connections accommodate vibrational and bending forces to which the printed circuit board might be subjected, while the rigid mechanical bonds accommodate shock forces. The result is a secure mounting of the components, assured terminal connections to the underlying printed circuit board elements, and consistent electrically conductive connections between the printed circuit and the mounted circuit components.

As a further accessory, the assembly is capable of providing external metallic strips that can be securely mounted to the side of the printed circuit board and protectively located beneath selected circuit components. These strips can serve as power buses to overcome limitations otherwise posed by the higher resistivity levels encountered in screened circuit traces.

BRIEF DESCRIPTION OF THE DRAWINGS

The invention is illustrated in the accompanying drawings, in which.

DETAILED DESCRIPTION OF THE PREFERRED EMBODIMENT

In compliance with the constitutional purpose of the Patent Laws "to promote the progress of science and useful arts" (Article 1, Section 8), applicant submits the following disclosure of the invention.

Figure 4:
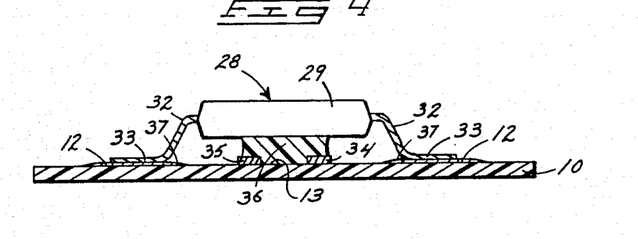
FIG. 4 is an enlarged sectional view taken along line 4—4 in FIG. 3.
Figure 5:
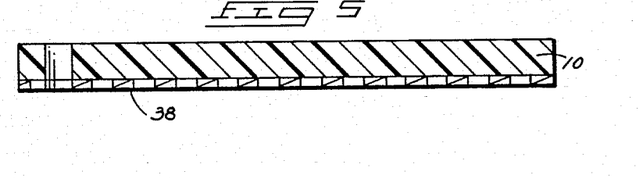
FIGS. 5 through 15 are a series of simplified schematic views illustrating the process steps for producing the printed circuit board and assembling circuit components to it.
Figure 6:
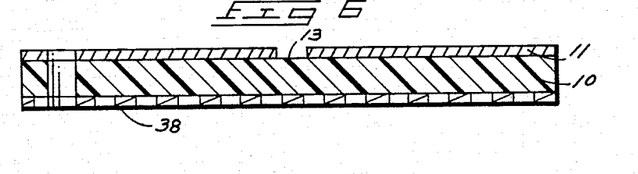

Generally speaking, the present invention relates to a circuit assembly including a printed circuit board substrate 10 having electrically conductive surface areas, shown in the drawings as pad areas 12, exposed at one side of the printed circuit board. An illustrate sectional view is shown in FIG. 4. A circuit component having a body portion 29 with an underside overlying the one side of the printed circuit board is located adjacent to the conductive surface areas 12. The conventional circuit components 28 have individual lead ends bent parallel to and overlying the conductive surface areas 12 on the printed circuit board. A first mass of adhesive 36 is sandwiched between the body portion 29 of the circuit component 28 and the one side of the printed circuit board for rigidly fixing the body portion 29 relative to an underlying surface area 13 on the printed circuit board. A second mass of adhesive 37 flexibly bonds the lead ends 33 of the circuit component to the underlying conductive surface areas. The second adhesive 37 is electrically conductive to complete the required circuit connections between the traces included in the printed circuit board and the external circuit component.

As used herein, the term "circuit component" shall mean any conventional or specially designed exterior circuit device having outwardly projecting leads or terminals capable of being bent to a position in which their lead ends are arranged in a common plane parallel to the plane of the conductive surface areas on the substrate 10 when the component is in a mounted position. This includes integrated circuit packages and microprocessor chips, which typically have lead ends bent in planes substantially perpendicular to their undersides. It also includes conventional small resistors and transistors, which are typically cylindrical in shape and have axially protruding leads at their opposite ends. It includes molded devices of various shapes which might have leads protruding outwardly from one or more sides, and devices which have bendable leads projecting outwardly beneath their undersides, such as light emitting diodes. It also includes various types of external connectors, such as pin connectors for detachably mounting an external cable to the printed circuit board, the connector again having bendable leads projecting from it. This system accommodates surface mounting of conventionally constructed electronic components which are more typically attached to a circuit board by other methods, but it can also be used for mounting surface mounted devices which are designed for such applications, but are typically attached to the surface of a circuit board by soldering.

While the circuit assembly shown in the drawings is described in relation to a printed circuit board having traces and pads produced by printing techniques, it is to be understood that the assembly is adaptable to any form of printed circuit board, including the more usual forms having conductive traces and pads produced by etching techniques. The substrate material on which the printed circuit boards is produced can be a polymer, such as Polyester (Mylar), or can be any other supportive material, including materials, such as glass or appropriately coated steel, which might be available in the housing of a product requiring a printed circuit board. Because the assembly requires no soldering, materials can be used as a substrate that are incapable of withstanding the elevated temperatures of molten solder. The circuit board can also take any shape, and need not always be planar.

The present method for mounting a circuit component to a printed circuit board having exposed conductive areas at one side of the printed circuit board involves the deposition of individual masses of electrically conductive thermosetting adhesive 37 on selected exposed conductive areas 12 at one side of the printed circuit board. The adhesive 37 is selected to have flexible properties after being cured. The body portion 29 of an external circuit component is then rigidly fastened to the one side of the printed circuit board while its lead ends 33 are caused to simultaneously engage the respective masses of electrically conductive thermosetting adhesive 37. The electrically conductive adhesive 37 is then heated to a permanent flexible cured state.

It is preferred that the step of fastening the body portion 29 of the circuit component to the printed circuit board be accomplished by interposing a relatively rigid mechanical adhesive 36 between the body portion 29 and an underlying area of the printed circuit board. The mechanical adhesive 36 should have rigid or semi-rigid properties when cured, to enable the resulting assembly to withstand shock loading forces. The flexible nature of the electrically conductive adhesive 37 that attaches the lead ends 33 of the circuit components to the underlying conductive areas of the printed circuit board assures production of electrical terminal connections which can withstand vibration and flexing of the supporting circuit board.

Figure 1:
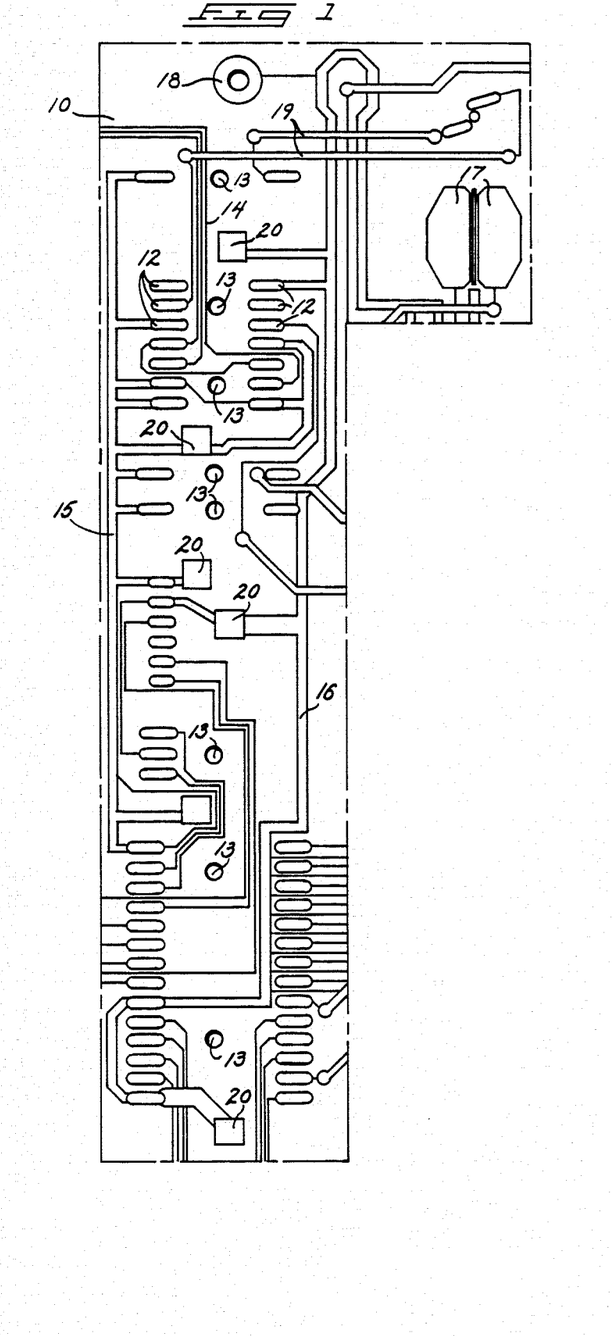
FIG. 1 is an enlarged fragmentary plan view of a portion of a printed circuit board designed for assembly of circuit components according to this disclosure.

The circuit assembly and method will now be described in conjunction with simplified plan view presentations of the apparatus in various stages of assembly in FIGS. 1 through 3, a cross-sectional showing in FIG. 4, and a series of schematic process views in FIGS. 5 through 15.

Referring to FIGS. 1 through 4, the printed circuit board is built upon a structural substrate 10 which is preferably made from planar sheet material that is electrically nonconducting or has an electrically insulating surface coating. An example of a suitable sheet material for substrate 10 is a polyester film identified by the trademark "Mylar". This material is available in various thicknesses, depending upon the degree of flexibility desired in the printed circuit board and the material costs which can be accommodated in a particular assembly.

A first conductive layer 11 is adhered to one side of the substrate 10, forming a prescribed circuit pattern which includes exposed surfaces areas to which the leads of the external circuit components are later to be connected. These conductive areas are shown in FIG. 1 as pad areas 12. The first conductive layer 11 also includes exposed switch pads 17 for external switch assemblies (not shown) which might be included in a keyboard or other device incorporating the printed circuit board. Auxiliary bus pads 20 are arranged across the general area of the printed circuit board on which the circuit components are to be located. One or more conductive eyelet pads 18 are also provided to permit subsequent completion of ground connections between the two sides of the final board assembly. The layer 11 typically presents a pattern of conductive traces interconnecting the various pad areas 12 and pads 17, 18, and 20. These traces more specifically include wider sections used as a ground bus 15 and a power bus 16 through which an external power supply (not shown) can be electrically connected to circuit components mounted on the printed circuit board.

The first conductive layer 11 is preferably formed on substrate 10 by printing techniques, such as silk screening or lithography. This can be accomplished by use of a conductive ink, such as a silver-filled polyester or other polymer binder system that can be applied by silk screen printing processes. An example of such an ink is sold as "ESL 1112-S Ag Conductive Inc." by Electro-Science Laboratories, of Pennsauken, N.J. This ink is cured by drying under elevated temperatures. A typical recommended cure cycle is one hour at a temperature of 60° C.

The first conductive layer 11 and the remaining unprinted surface area of substrate 10 are substantially covered by a first dielectric layer 21, which can also be applied by a screening process. The single layer 21 can be in the form of multiple layers successively applied to the assembly to increase reliability. The layer 21 can be any electrically nonconductive coating that is printable. As an example, a conventional dielectric solder resist sold as "M&T #320UV Curable Solder Mask" by M&T Chemicals, Inc. of Rahway, N.J. has been used. This layer is ultra-violet radiation curable.

The first dielectric layer 21 leaves the pad areas 12 and the previously-described pads 17, 18 and 20 exposed, as well as a series of uncovered areas 13 located adjacent to the pad areas 12 about the one side of substrate 10. The uncovered areas 13 are ultimately used for securing direct adhesive bonds between the body portion 29 of each circuit component and the substrate 10. They are shown in FIG. 1 as being circular in shape, but can have any other desired shape.

A second conductive layer 22 can be applied over the first dielectric layer 21 to produce conductive jumpers that cannot be included in the traces presented within the first conductive layer 11. Typical jumpers 19 are shown in FIGS. 1 through 3, extending between pad surfaces exposed through the covering dielectric layer 21. The layer 22 can alternatively be resistive. The second conductive layer 22 is preferably printed by use of the same materials and techniques as used for production of the first conductive layer 11.

A second dielectric layer 23 substantially covers the exterior of the printed circuit board, again exposing the uncovered areas 13 about substrate 10, the terminal pad areas 12, and the various functional pads 17, 18 and 20. It is produced by use of the same materials and techniques as used in the production of the first dielectric layer 21.

The prepared printed circuit board, shown in FIG. 1, has an outer electrically insulated coating that exposes the uncovered areas 13 by which the circuit components are bonded to the substrate 10, as well as the conductive areas about the switch pads 17, eyelet pads 18, auxiliary bus pads 20 and the pad areas 12 to which the circuit component leads are subsequently connected.

Where required, the remaining side of the printed circuit board can be covered by a conductive screened grid, which can serve as a ground plane. A conductive metal eyelet 39 can be used to electrically connect a ground trace on the first side of the board to the grid, which is shown in more detail in FIGS. 5–15. If a two-sided board is necessary for circuit design purposes, both sides can be screened with traces and pads as previously discussed. Surface-mounted circuit devices can then be provided at both sides of the supporting substrate 10.

The utilization of silk screen printed conductive traces presents design problems with respect to the size of printed traces required for power bus leads to circuit components such as integrated circuits and microprocessor chips. In order to minimize the voltage drop through the printed conductive traces, it is preferable to add two solid metal strips 34, 35 which serve as power buses to partially shunt the printed ground bus 15 and power bus 16. They serve as a ground bus (strip 34) and a power bus (strip 35). As an example, each strip can be produced from solid copper metal tape having an adhesive back that secures the tape directly to the exterior of the second dielectric layer 23 on the printed circuit board.

The ground strip 34 and power strip 35 are preferably arranged parallel to one another at opposite sides of the uncovered areas 13 of substrate 10. Each overlaps a number of the previously-described bus pads 20, which have a transverse width greater than the width of the strips 34, 35. The minimum spacing between strips 34, 35 should be no less than the transverse width of uncovered areas 13. The maximum width across the two strips 34, 35 should be less than the transverse spacing between the pad areas 12, to which the lead ends of the circuit components will subsequently be mounted. These spacings permit strips 34, 35 to be located beneath the circuit components to minimize strip length and physically protect strips 34, 35 from damage.

Figure 2:
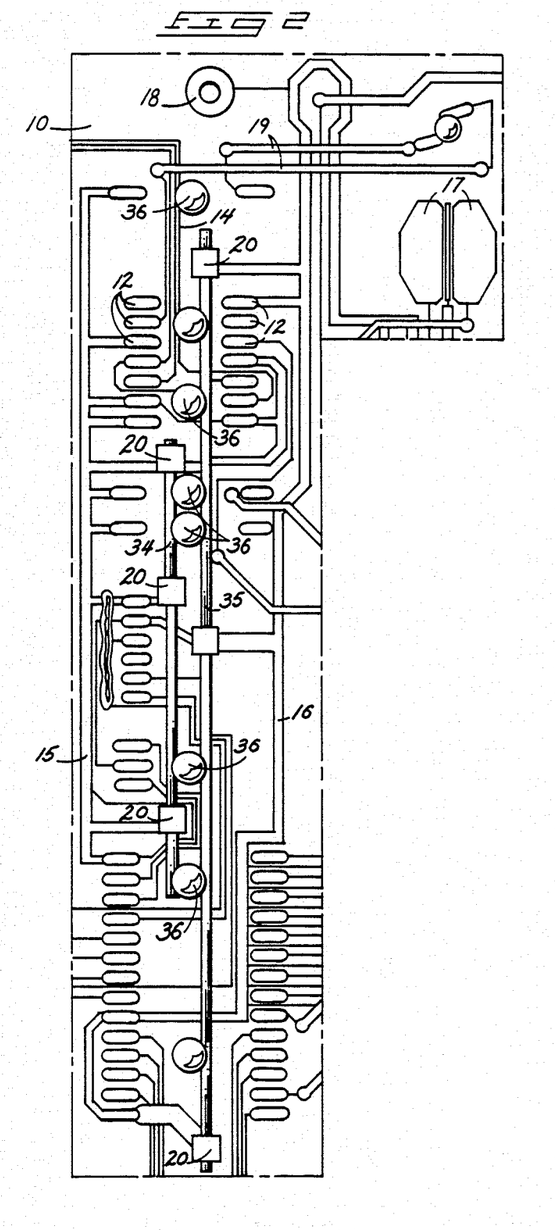
FIG. 2 is a view similar to FIG. 1, with the metallic strips and adhesives in place.

As shown in FIG. 2, a first adhesive mass 36 is located on the outer surface of the printed circuit board, overlying the uncovered areas 13 of substrate 10, as well as a portion of the outer surfaces of the conductive strips 34 and 35. This first adhesive is preferably an electrically nonconducting resin, such as polyurethane, which is thermosetting to a relatively rigid condition when fully cured. An example is an isocyanate prepolymer, one component urethane adhesive. The adhesive is sold by H. B. Fuller Company, Minneapolis, Minn., as UR-1100. It must be capable of bonding to the substrate material and to the underside of the circuit components mounted to the printed circuit board. The applied adhesive mass 36 is preferably in a relatively viscous state, being initially in the form of upstanding mounts or "buttons" projecting outwardly from the printed circuit board.

Individual masses of a second adhesive 37 cover the pad areas 12 and the auxiliary bus pads 20 about the printed circuit board surface. The second adhesive 37 is electrically conductive, preferably including an electrically conductive powder as a filler within an elastomeric binder, such as polyurethane. The second adhesive 37 is also thermosetting, being cross-linked or dried under heated conditions to a permanent flexible state when cured. It is used to provide direct electrical connections between the lead ends 33 of the circuit components and the exposed conductive pad areas 12 in the printed circuit to which such leads are to be attached. It is also used to provide electrical connections between the auxiliary bus pads 20 and the overlying strips 34 and 35. When so connected, the strips 34, 35 shunt substantial lengths of the printed buses 15 and 16.

The conductive adhesive is composed of two portions—the conductive particle portion and the organic binder portion. The conductive portion can be any conductive material. This includes nickel, copper, carbon, gold, platinum and mixtures and alloys thereof. Fine flakes of silver particle form is preferred in the conductive adhesive.

The organic binder portion consists of isocyanate prepolymer, with ether and blocked urethane groups. The resin also includes a curing agent, which can be diamine.

The prepolymer resin has a viscosity in the range from about 600 to 1200 pascal seconds at 25 deg. C. Available NCO is 2.4%. The resin is sold by Mobay Chemical Corporation, Pittsburgh, PA as desmocap 11A blocked isocyanate prepolymer.

A liquid, aromatic diamine is preferred as a curing agent. One that is used is sold by CIBA-GEIGY Corporation, Hawthorne, N.Y., as hardener XU 205, a liquid aromatic Diamine hardener.

The silver conductive adhesive has been prepared by mixing 150 g of silver flakes (Handy & Harman 135, 56 g of Desmocap 11A, 3.5 g of XU 205 and 35 g of aliphatic dibasic and acid esters (DuPont DBE) as solvent. The mixture is then milled by a three roll mill.

The silver conductive adhesive is screenable. After being cured at 125 deg. C. for 30 minutes the material has an elongation equal to or greater than 100%. The adhesion to tin metal and silver ink pad is very good. The resistivity of the cured material is also in an acceptable range.

Figure 3:
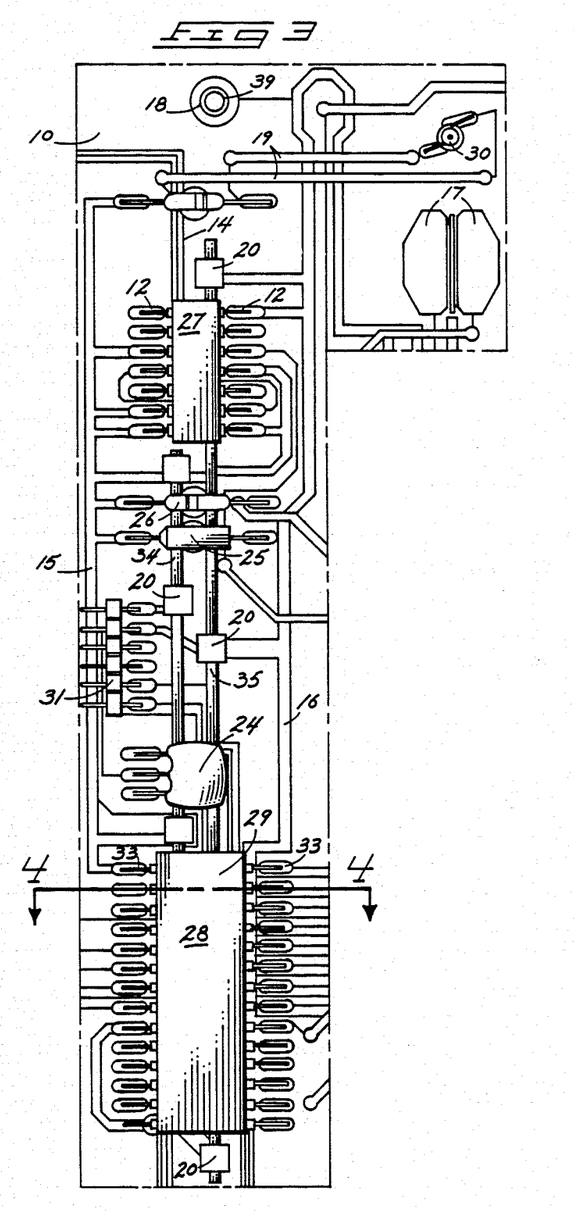
FIG. 3 is a view similar to FIG. 1, showing the assembled structure.

FIG. 3 illustrates a variety of circuit components mounted to the underlying printed circuit board. Included in a specially designed resonator 24, a capacitor 25, a resistor 26, an integrated circuit 27, a microprocessor 28, a light emitting diode 30, and an external pin connector 31. These circuit components are conventional in structure. Their only modifications involve the bending of leads 32 where necessary to produce lead ends 33 located within a common plane. The degree of bending of the leads 32 attached to a typical conventional circuit component is such that the underside of each lead end 33 is offset beneath the underside of body 29 on each circuit component, thereby spacing the underside of the body portion 29 slightly above the printed circuit board when the lead ends 33 are in engagement with it. This relationship is best seen in FIG. 4. When desired, lead ends 33 can also be bent beneath the body portion of the component.

As seen in FIGS. 3 and 4, each circuit component is mounted to the printed circuit board by a synergistic combination of the two adhesives 36 and 37. The first adhesive 36 provides a relatively rigid mechanical bond between the body portion of each circuit component and the printed circuit board to maintain it in a substantially fixed position when subjected to shock loading forces. The adhesive 36 is preferably anchored directly to the substrate 10 to prevent subsequent delamination of underlying coating layers. It also preferably overlaps at least a portion of the metal strips 34 and 35, thereby helping to protect them from external damage and further securing them against displacement. The strips 34 and 35 are also protected from external damage by being located beneath the circuit components themselves.

The second adhesive 37 provides a permanent flexible connection between each lead 32 and the printed circuit board. This flexible connection can absorb vibration and bending forces encountered in the area of the printed circuit board where the circuit component is mounted.

The fact that adhesive 37 is flexible in relation to the rigid nature of adhesive 36 is central to this disclosure. A flexible electrical connection to each lead end 33 is necessary to accommodate vibrational and bending forces that might dislodge the relatively small connections to lead ends 33. However, since the conductive properties of the cured adhesive 37 can be modified by stretching or contracting it, the more rigid connection afforded to the body portions by adhesive 36 assures more consistent electrical conductive properties through cured adhesive 37 by minimizing such activity. The rigid adhesive also absorbs shock loads and the greater inertial forces encountered in the support of the relatively large solid body portions, as opposed to the smaller flexible leads.

The two adhesive systems therefore combine to counteract the otherwise disruptive forces and loads to which printed circuit boards having attached circuit components are typically subjected. This assures an effective and continuous electrical connection at each lead, as well as a permanent structural connection between the circuit board and the body portion 29 of each circuit component. The arrangement is adaptable to any conventional or specially designed circuit component having bendable protruding leads that can be arranged at one or more of its sides.

The method for producing the printed circuit board and subsequently mounting the circuit components to it is best understood by the series of schematic views shown in FIGS. 5 through 15. These views, which are presented to illustrate the essential layered arrangement through the board and components, begin with the step of screening a ground grid or shield 38 about the back plane of substrate 10 (see FIG. 5). The ground grid 38 is preferably an open rectangular grid printed in carbon ink or other suitable ink that is electrically conductive.

The provision of this ground grid is not critical to the mechanical and electrical properties of the improvements to which this disclosure is directed, but is included as part of the overall process where a ground plane might be desirable.

The screening about the operational side of substrate 11 is initiated by application of the first conductive layer 11 (FIG. 6), which presents a preselected pattern of pad areas and connecting traces through which the primary printed circuit connections are achieved.

Figure 7:
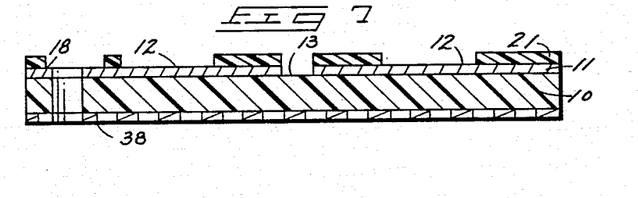
Figure 8:
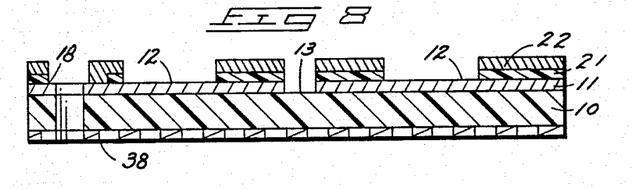
Figure 9:
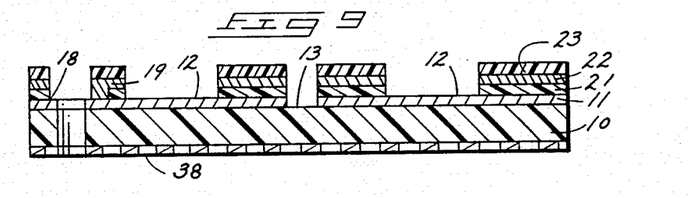

The first conductive layer 11 is then substantially covered by the first screened dielectric layer 21 (FIG. 7). Layer 21 is applied over layer 11, leaving pad areas 12 and the previously-described pads 17, 18, and 20 exposed. Layer 21 also exposes the desired uncovered areas 13 located about substrate 10 where the circuit components are later mechanically bonded. In FIG. 3 and in the remaining Figures of this sequence, the various coating layers are illustrated with a continuous planar outside surface relative to the supporting substrate 10. This has been done for illustrative purposes only, to simplify the schematic presentation of the various layers. In actual practice, the layers each have constant thickness. They overlap one another at their edges to produce a varying total thickness across the printed circuit board, dependent upon the total number of layers at any particular location on the board.

The process continues by applying the second conductive layer 22 (FIG. 8) to form jumpers 19 across the traces included within the first conductive layer 11. The layer 22 is subsequently covered by the second dielectric layer 23 (FIG. 9), again leaving the uncovered areas 13, pad areas 12, and pads 17, 18 and 20 exposed.

It is to be understood that each layer 11, 21, 22 and 23 is individually applied and allowed to dry before the next layer is added. The printing and drying techniques required for this method are well known and within the skill of those familiar with the production of printed circuit boards by printing techniques.

Figure 10:
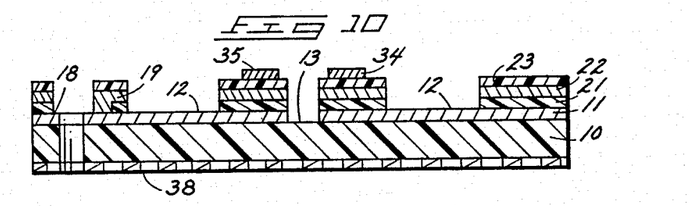

The strips 34, 35, which serve as buses, are applied over the screened laminations by adhesively pressing the solid metal tape against the outer surface of the second dielectric layer 23 (FIG. 10). They are located immediately to each side of the uncovered areas 13 exposed about the substrate 10.

Figure 11:
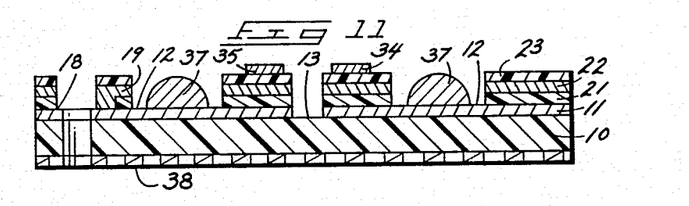
Figure 12:
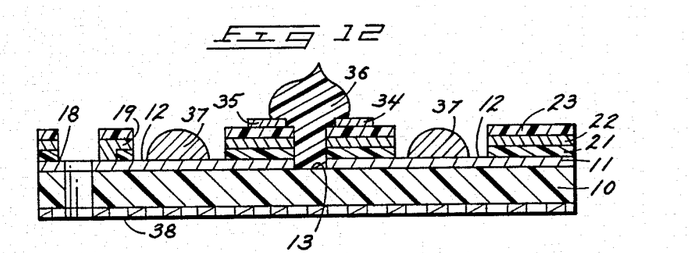
Figure 13:
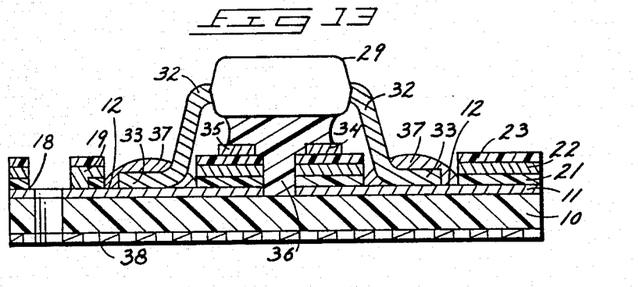

Deposits of the conductive adhesive 37 are then applied to the pad areas 12 and onto the bus pads 20, also coating the strips 34 and 35 (FIG. 11). The adhesive 37 can be injected, where needed, but is more preferably applied by stenciling procedures.

The mechanical adhesive 36 is injected onto the printed circuit board (FIG. 12) by forming upstanding viscous buttons or mounds of adhesive over the uncovered areas 13 of substrate 10 and adjacent areas of the outer dielectric layer 23 and strips 34 and 35.

With both adhesives 36 and 37 in a liquid state, the circuit components are formed by bending their leads 32 relative to their body portions 29, as previously detailed. Where necessary, the bent lead ends 33 are trimmed to a desired uniform length. The circuit components are then pressed into place against the receiving printed circuit board surfaces (FIG. 13) to sandwich the mechanical adhesive 36 between the body portion 29 and the printed circuit board, and to bring the individual lead ends 33 into engagement with the individual deposits of conductive adhesive 37.

Figure 14:
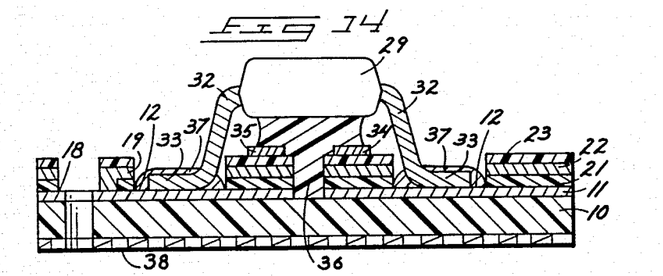

Because of the relatively low heat required to cure the adhesives usable in this system, the entire assembly can be placed within an oven to set the adhesives 36 and 37 (FIG. 14). In the described typical polyurethane systems, the adhesives can be cured at a temperature of 125° C. for a period of twenty minutes. The long cure time is required in order to adequately dry the flexible adhesive 37. The mechanical adhesive 36, which polymerizes, typically cures in about one minute.

Figure 15:
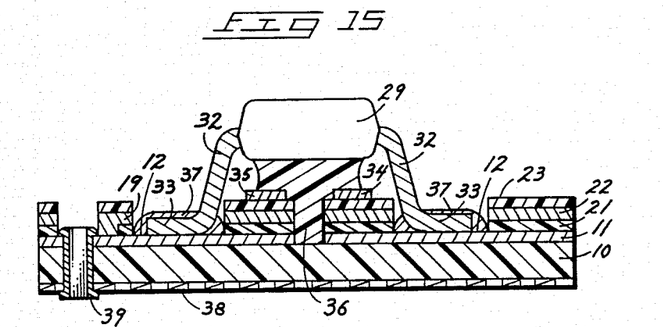

The final assembly step involves the placement of eyelets 39 or metal grommets through apertures surrounded by the pads 18 to complete ground connections between the two sides of the printed circuit board (FIG. 15). These eyelets 39 are the only components of the board which extend across the two opposing surfaces of substrate 10.

The above process possesses many advantages in comparison to previously-known processes for producing printed circuit boards. One is its capability to mount circuit components to layers of material used in the underlying board structure which cannot withstand the heat associated with conventional soldering techniques. The board substrate can be produced from sheet materials that have melting points below the melting point of solder. Since the process lends itself to printing techniques for producing the printed circuit board assembly, it eliminates the more expensive copper clad substrates and wet processing techniques associated with production of printed circuit boards by etching or plating. The process also lends itself readily to full automation, using robotics or specially designed tooling for placement of the circuit components on the board.

A major advantage of this system is its application to standard printed circuit board structures and standard circuit components having standard leads. Unlike prior systems for surface mounting circuit components, the present technique is not limited to specially designed component structures.

Finally, this system is extremely versatile. It can be used to mount any circuit component, including connectors and large integrated circuits, which have not been adequately incorporated within previously-known surface mounting systems.

While the electrical connections between the circuit component leads and the conductive layers of the circuit board are permanent and not easily repairable, this shortcoming is offset by the relatively lower cost of the final assembly. The cost savings are so significant that defective boards can be discarded economically. Higher productivity is available by fully automating the production system; however, this system can more easily be accomplished by hand as opposed to conventional surface mounted device technology.

In compliance with the statue, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims, appropriately interpreted in accordance with the doctrine of equivalents.

We claim:

1. A shock and vibration resistant printed circuit board assembly, comprising:
   a printed circuit substrate;
   a first layer of electrically conductive ink screened onto one side of the substrate forming an electrical circuit pattern that includes electrical terminal pad areas;
   at least one leaded circuit component having a body portion with an underside overlying the one side of said printed circuit board, said circuit component having individual lead ends overlying said terminal pad areas;
   a first adhesive means sandwiched between the underside of the body portion of the leaded circuit component and the one side of the printed circuit board for fixing the body portion relative to the substrate to maintain the leaded component in a fixed position and prevent the leaded circuit component from moving relative to the printed circuit board when the printed circuit board is subject to shock forces;
   a second adhesive means bonding the lead ends of said circuit component electrically to the terminal pad areas to physically secure the lead ends to the terminal pad areas; and
   said second adhesive means being non-solder, electrically conductive and permanently flexible and having significantly greater flexibility than said first adhesive when curved to electrically and flexibly interconnect the lead ends to the terminal pad areas to prevent separation of the lead end and the terminal pad areas when the printed circuit board is subjected to vibration and bending forces.

2. The shock and vibration resistant printed circuit board assembly, as defined in claim 1 further comprising:
   a first layer of dielectric ink screened onto the one side overlying the first conductive ink layer leaving the terminal pad areas exposed to receive the second adhesive;
   a second layer of electrically conductive ink screened onto the one side overlying the first dielectric ink layer and electrically interconnecting two or more of the terminal pad areas forming conductive jumpers crossing over the electrical circuit of the first conductive ink layer.

3. The shock and vibration resistant printed circuit board assembly as defined in claim 1 wherein the electrical circuit of the first conductive ink layer includes bus pad areas and wherein the assembly further comprises:
   a first layer of dielectric ink screened onto the one side overlying the first conductive ink layer leaving the terminal pad areas and the bus pad areas exposed;
   conductive solid metal bus strips mounted on the one side overlying the first dielectric ink layer extending between the bus pad areas;
   wherein the second adhesive means further bonds the solid metal conductive bus strips to the exposed bus pad areas to electrically interconnect the bus pad areas.

4. The shock and vibration resistant printed circuit board assembly as defined in claim 3 wherein at least one of the solid metal bus strips extends underneath the body portion of the circuit component with the first adhesive securing the solid metal bus strip to the one side beneath the circuit component.

5. The shock and vibration resistant printed circuit board assembly as defined in claim 1 wherein the printed circuit substrate is made of a flexible polymer sheet material.

6. The shock and vibration resistant printed circuit board assembly as defined in claim 1 further comprising:
an underneath layer of electrically conductive ink screened onto the other side of the printed circuit substrate forming an electrical ground plane; and
means electrically interconnecting the underneath layer and at least one location of the electrical circuit pattern of the first conductive ink layer to connect the electrical ground plane to the electrical circuit pattern.

7. The shock and vibration resistant printed circuit board assembly as defined in claim 1 wherein the substrate has an exposed surface area directly beneath the body portion of the leaded circuit component and wherein the first adhesive bonds the body portion of the leaded circuit component directly to the exposed surface of the substrate to rigidly affix the electrical component to the substrate to prevent the leaded circuit component from moving relative to the substrate when the printed circuit board is subjected to shock forces.

8. The shock and vibration resistant printed circuit board assembly as defined in claim 1 wherein the second adhesive means comprises a polyurethane binder containing a filler of electrically conductive powder.

9. A shock and vibration resistant printed circuit board assembly, comprising:
a printed circuit substrate;
a first layer of electrically conductive ink screened onto one side of the substrate forming an electrical circuit pattern that includes electrical terminal pad areas and bus pad areas;
a first layer of dielectric ink screened onto the one side overlying the first conductive ink layer leaving the terminal pad areas exposed;
at least one leaded circuit component having a body portion with an underside overlying the one side and lead ends overlying the terminal pad areas;
conductive metal bus strips mounted on the one side overlying the first dielectric ink layer and extending between the bus pad areas;
a first adhesive means bonding the underside of the body portion of the leaded circuit component to the one side of the printed circuit board for fixing the component relative to the printed circuit board to prevent the leaded circuit component from moving relative to the printed circuit board when the printed circuit board is subject to shock forces; and
a second adhesive means bonding the leaded ends to the terminal pad areas and bonding the conductive metal bus strips mounted to the bus pad areas, in which the second adhesive means is formed on a non-solder, electrically conductive and permanently flexible adhesive material having significantly greater permanent flexibility when cured than the first adhesive to electrically and flexibly permanently bond the lead ends and the conductive metal bus strips to the pad areas to prevent unbonding when the printed circuit board is subject to vibration and bending forces.

10. The shock and vibration resistant printed circuit board assembly as defined in claim 9 wherein the conductive metal bus strips extend underneath the body portion of the leaded circuit component and wherein the first adhesive supports the body portion of the leaded circuit component elevated above the conductive metal bus strips.

11. The shock and vibration resistant printed circuit board assembly as defined in claim 9 wherein the first adhesive additionally engages and secures the conductive metal bus strips to the one side beneath the body portion of the leaded circuit component.

12. The shock and vibration resistant printed circuit board assembly, as defined in claim 9 further comprising:
a second layer of electrically conductive ink screened onto the one side overlying the first dielectric ink layer and electrically interconnecting two or more of the terminal pad areas forming conductive jumpers crossing over the electrical circuit of the first conductive ink layer.

13. A shock and vibration resistant printed circuit board assembly, comprising:
a printed circuit substrate;
a first layer of electrically conductive ink screened onto one side of the substrate forming an electrical circuit pattern that includes a plurality of electrical terminal pad areas;
a first layer of dielectric ink screened onto the one side overlying the first conductive ink layer leaving the terminal pad areas exposed;
a second layer of electrically conductive ink screened onto the one side overlying the first dielectric ink layer and electrically interconnecting a portion of the terminal pad areas forming conductive jumpers crossing over the electrical circuit of the first layers while leaving the remaining terminal pad areas exposed;
a second layer of dielectric ink screened onto the one side overlying the second conductive ink layer leaving the remaining terminal areas exposed;
at least one leaded electrical circuit component mounted on the printed circuit board having individual lead ends overlying the exposed terminal areas;
a first adhesive means bonding the leaded electrical circuit component rigidly to the substrate to prevent the leaded circuit component from moving relative to the substrate when the circuit board is subject to shock forces; and
a second adhesive means bonding the lead ends of the circuit component electrically to the exposed terminal areas, in which the second adhesive means is composed of a non-solder, electrically conductive and permanently flexible adhesive material to electrically and flexibly interconnect the lead ends to the terminal pad areas to prevent their separation when the printed circuit board is subjected to vibration and bending force.

14. A method for mounting a leaded circuit component having lead ends extending from a body portion thereof onto a printed circuit board having exposed conductive areas on one surface, comprising the following steps:
depositing a thermosetting, electrically conductive adhesive having elastomeric properties when cured onto exposed conductive areas of the printed circuit board in an areal pattern corresponding to a preselected pattern of attachment for the lead ends of the electrical component;
depositing a thermosetting support adhesive having structural properties which are relatively more rigid than said electrically conductive adhesive when cured onto the one surface of the printed circuit board in an areal pattern corresponding to a preselected placement for the body portion of the electrical component;

placing the circuit component over the one surface of the printed circuit board with its lead ends parallel to its underside, whereby the lead ends engage the electrically conductive adhesive as the body portion simultaneously engages the support adhesive; and heating the adhesives to cure them to stable conditions wherein the lead ends of the circuit component are flexibly and electrically interconnected to the conductive areas on the printed circuit board to prevent conductive separation of the lead ends and the conductive areas when the printed circuit board is subjected to vibration and bending forces and its body portion is fixed to the one side of the printed circuit board to prevent the circuit component from moving relative to the printed circuit board when the printed circuit board is subjected to shock forces.

15. The method of claim 14 wherein the printed circuit board comprises a substrate of sheet material having one or more covering layers at said one side thereof;

wherein the step of depositing the support adhesive involves applying the support adhesive in direct contact with the substrate to secure the circuit component directly to the substrate.

16. The method of claim 14 wherein the electrically conductive adhesive comprises a flexible polyurethane resin containing a filler of electrically conductive powder.

17. The method of claim 14 wherein the support adhesive comprises a rigid polyurethane resin.

18. A method for producing a printed circuit board, comprising the following steps:

applying a first layer comprising electrically conductive material to one side of a substrate of sheet material in a predetermined circuit pattern including conductive pad areas designed for future attachment to lead ends of leaded circuit components subsequently mounted to the printed circuit board;

partially covering the layer of electrically conductive material with a second layer comprising electrically insulating material, leaving the pad areas exposed to the exterior of the printed circuit board;

applying to the second layer of electrically insulating material a third layer comprising electrically conductive material in a predetermined pattern including conductive jumpers extending across the circuit pattern of the first layer and interconnecting a portion of the conductive pad areas leaving unconnected conductive pad areas exposed;

applying to the third layer of electrically conductive material a fourth layer of comprising electrically insulating material;

the steps of applying the respective second, third and fourth layers in a manner leaving the unconnected pad areas exposed to the exterior of the printed circuit board.

19. The method of claim 18 comprising the following additional steps:

applying strips of solid conductive metal over the fourth layer extending between and overlying two or more of the unconnected pads areas;

and bonding strips to the overlayed pad areas by an electrically conductive adhesive.

20. The method of claim 19 further comprising the following steps:

placing a circuit component over the strips;

and simultaneously bonding the body portion of the circuit component to the printed circuit board while bonding its lead ends to adjacent pad areas; and the lead ends of the circuit component being bonded to the pad areas by a flexible, electrically conductive adhesive.

21. The method of claim 19 wherein pad areas are presented at opposite sides of the strips, further comprising the following steps:

placing a circuit component over the strips;

and simultaneously bonding the body portion of the circuit component to the printed circuit board while bonding its lead ends to adjacent pad areas;

the lead ends of the circuit component being bonded to the pad areas by a flexible, electrically conductive adhesive;

the body portion of the circuit component being bonded to the uncovered area of the substrate by a rigid adhesive.

* * * * *